United States Patent [19]

Matsuda et al.

[11] Patent Number: 5,248,622
[45] Date of Patent: Sep. 28, 1993

[54] FINELY CONTROLLED SEMICONDUCTOR DEVICE AND METHOD OF MANUFACTURING THE SAME

[75] Inventors: Hideo Matsuda; Takashi Fujiwara, both of Yokohama; Takeomi Yoshida, Kawasaki, all of Japan

[73] Assignee: Kabushiki Kashiba Toshiba, Kawasaki, Japan

[21] Appl. No.: 859,918

[22] Filed: May 22, 1992

Related U.S. Application Data

[60] Division of Ser. No. 633,186, Dec. 28, 1990, Pat. No. 5,148,254, which is a continuation of Ser. No. 403,871, Sep. 7, 1989, abandoned.

[30] Foreign Application Priority Data

Oct. 4, 1988 [JP] Japan .................. 63-250456

[51] Int. Cl.$^5$ ......................................... H01L 21/332
[52] U.S. Cl. ............................................ 437/6; 437/911
[58] Field of Search .................. 437/6, 911; 257/747

[56] References Cited

U.S. PATENT DOCUMENTS

| | | |
|---|---|---|
| 4,443,810 | 4/1984 | Yatsuo et al. |
| 4,450,467 | 5/1984 | Nagano et al. |
| 4,662,957 | 5/1987 | Hagino ............................. 437/6 |
| 4,689,647 | 8/1987 | Nakagawa et al. |
| 4,951,110 | 8/1990 | Miller et al. |
| 5,156,981 | 10/1992 | Kitagawa et al. ...................... 437/6 |

FOREIGN PATENT DOCUMENTS

| | | |
|---|---|---|
| 0206136 | 12/1986 | European Pat. Off. |
| 3742638 | 6/1989 | Fed. Rep. of Germany. |
| 57-1257 | 1/1982 | Japan. |
| 60-85563 | 5/1985 | Japan. |
| 62-32646 | 2/1987 | Japan ................................ 437/6 |
| 63-209167 | 8/1988 | Japan. |

OTHER PUBLICATIONS

Patent Abstracts of Japan, vol. 12, No. 489 (E-698) [3345], Dec. 26, 1988.
Patent Abstracts of Japan, vol. 9, No. 230 (E-343) [1953], Sep. 17, 1985.
Patent Abstracts of Japan, vol. 6, No. 60 (E-102) [938]Apr. 17, 1982.

Primary Examiner—T. N. Quach
Attorney, Agent, or Firm—Finnegan, Henderson, Farabow, Garrett & Dunner

[57] ABSTRACT

A semiconductor device includes a substrate of a first conductivity type. A first layer of a second conductivity type is formed on one surface of the substrate of the first conductivity type. A second layer of the first conductivity type is formed on the first layer of the second conductivity type. A third layer of the first conductivity type is selectively formed on the other surface of the substrate of the first conductivity type. A fourth layer of the second conductivity type is formed on the other surface of the substrate of the first conductivity type. The vertical dimension of the fourth layer falls within a range of 5 to 20 μm and is smaller than that of the first layer.

8 Claims, 8 Drawing Sheets

FINELY CONTROLLED SEMICONDUCTOR DEVICE AND METHOD OF MANUFACTURING THE SAME

This is a division of application Ser. No. 07/633,186, filed Dec. 28, 1990, now U.S. Pat. No. 5,148,254, which is a continuation application of Ser. No. 07/403,871, filed Sep. 7, 1989, now abandoned.

BACKGROUND OF THE INVENTION

1. Field of the Invention

The present invention relates to a semiconductor device and a method of manufacturing the same and, more particularly, to a semiconductor device constituting an anode short type gate turn-off thyristor (to be referred to as a GTO hereinafter) and a method of manufacturing the same.

2. Description of the Related Art

In a conventional method of manufacturing a semiconductor device having a GTO structure, in order to connect an electrode to a GTO body, a brazing technique is used. An application of the technique will be described below with reference to FIG. 1. In this case, a silicon laminated structure consisting of a p-type P1 layer 1, an n-type N1 layer 2, a p-type P2 layer 3, and an n-type N2 layer 4 is formed first. The P1 layer is then brazed to an anode electrode plate 5 consisting of Mo or W by using an Al layer 6 as a solder. Subsequently, gate and cathode electrodes 7 and 8 are respectively formed on the P2 and N2 layers. A peripheral portion of the resultant structure is beveled, and a silicone resin 9 is coated thereon. In a GTO of this structure, the P1 layer may be fused in the Al layer 6 as a solder, so that the solder 6 and the N1 layer 2 may be brought into contact with each other at, e.g., a portion denoted by reference symbol A. A conventional technique for preventing this will be described below with reference to FIGS. 2 and 3.

FIG. 2 shows an anode short type GTO whose anode side is patterned. In this arrangement, an N1+ layer is partially diffused first, and a P1 layer is formed by diffusion. At this time, in order to prevent contact as described above, the N1+ and P1 layers are formed deep. However, since the N1+ layer is laterally diffused at the same time, a portion $X_{N1+}$ is expanded, and a portion $X_{P1}$ is reduced accordingly. As a result, an effective region of a current flow is reduced. In addition, fine control during patterning becomes difficult. Therefore, variations in GTO characteristics occur.

A GTO having an arrangement shown in FIG. 3 will be described below. In this arrangement, a P1 layer is diffused deep first, and an N1+ layer is diffused. This method is advantageous in that a portion $X_{N1+}$ can be formed to be narrow. As described above, however, the P1 layer cannot be controlled due to lateral diffusion. In addition, a resistance component R (shown in FIG. 3) near the N1+ layer is increased, and the electrical characteristics are degraded.

SUMMARY OF THE INVENTION

It is, therefore, an object of the present invention to provide a semiconductor device whose characteristics are improved by enabling fine control during patterning.

It is another object of this invention to provide a method of manufacturing a semiconductor device whose characteristics are improved by enabling fine control during patterning.

The first object can be achieved by a semiconductor device comprising:

a substrate of a first conductivity type;

a first layer of a second conductivity type formed on one surface of said first substrate of the first conductivity type;

a second layer of the first conductivity type formed on the first layer of the second conductivity type;

a third layer of the first conductivity type selectively formed on the other surface of the substrate of the first conductivity type; and a fourth layer of the second conductivity type formed on the other surface of the substrate of the first conductivity type, a vertical dimension of the fourth layer being smaller than that of the first layer.

The second object can be achieved by a method of manufacturing a semiconductor device, comprising the steps of:

providing a substrate of a first conductivity type which has a relatively high resistivity;

forming a first layer of a second conductivity type on one surface of the substrate;

forming a second layer of the first conductivity type on one surface of the first layer;

selectively forming a third layer of the first conductivity type on the other surface of the substrate;

forming a fourth layer of the second conductivity type on the other surface of the substrate so as to be shallower than the first and third layers and to have an impurity concentration higher than that of the substrate and lower than that of the third layer;

forming a gate electrode on a selected portion of the one surface of the first layer;

forming a first main electrode on one surface of the second layer; and forming a second main electrode on the third and fourth layers.

BRIEF DESCRIPTION OF THE DRAWINGS

The foregoing aspects and other features of the invention will be explained in the following description in connection with the accompanying drawings wherein.

DETAILED DESCRIPTION OF THE PREFERRED EMBODIMENTS

A semiconductor device according to a first embodiment of the present invention will be described below with reference to the accompanying drawings.

Figure 1:
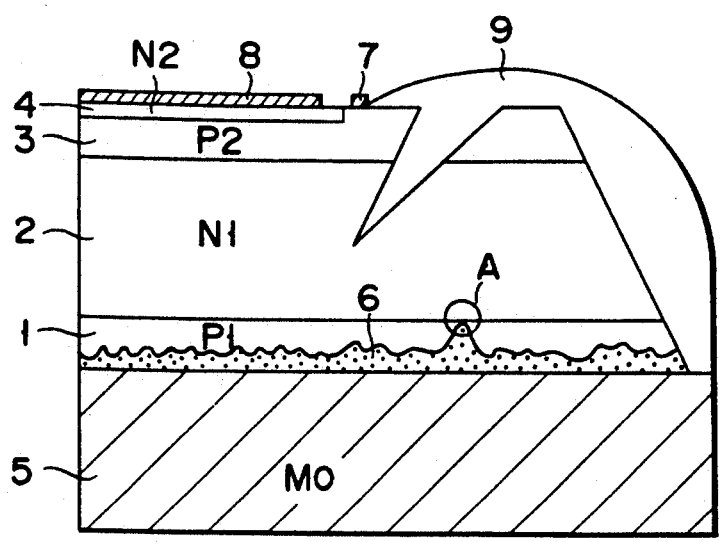
FIGS. 1 to 3 are views for explaining the drawbacks of conventional semiconductor devices.
Figure 2:
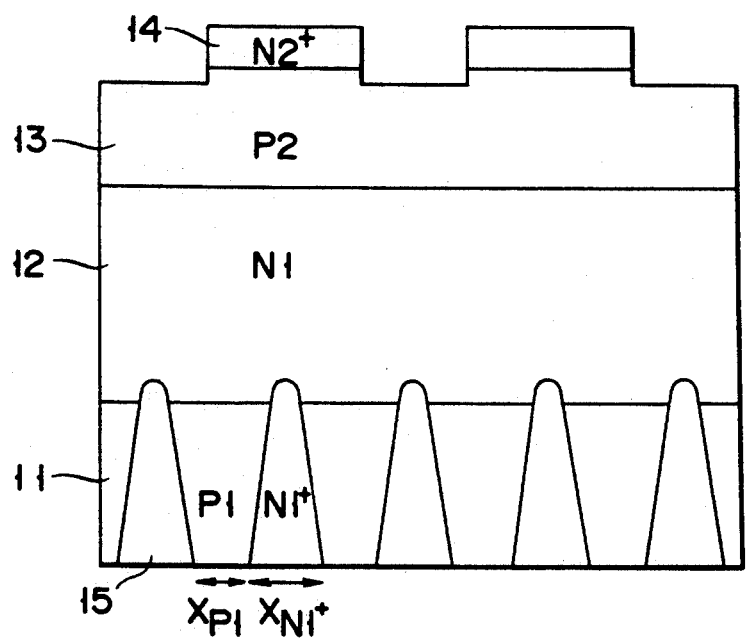
Figure 3:
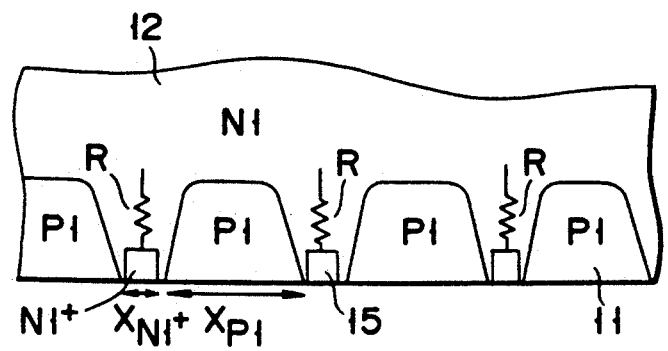
Figure 4:
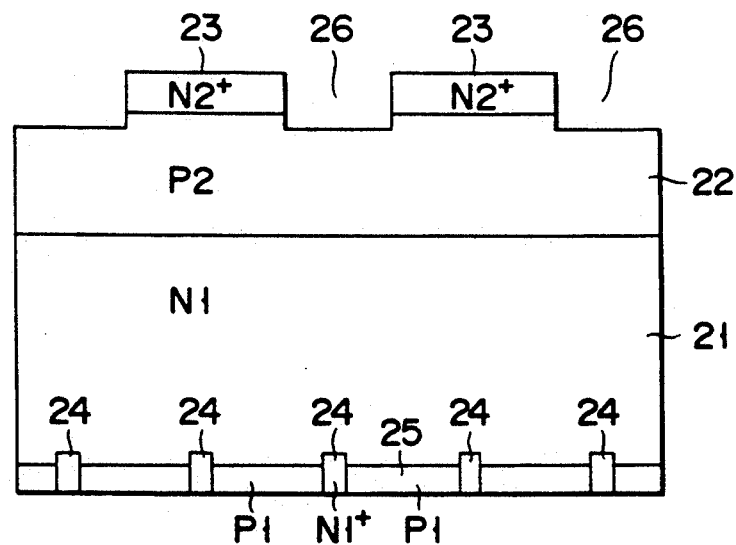
FIG. 4 is a view showing an arrangement of a main part of a semiconductor device according to a first embodiment of the present invention.

FIG. 4 is a sectional view showing an arrangement of a GTO body of a semiconductor device of the present invention. Reference numeral 21 denotes an n-type silicon substrate (N1) layer; 22, a p-type base layer (P2) layer formed on a surface of the N1 layer by diffusion; 23, an n+-type emitter layer (N2+ layer) formed on the upper surface of the P2 layer by diffusion; 24, an n+-type base layer (N1+ layer) selectively formed on the lower surface of the N1 layer by diffusion; and 25, a p-type emitter layer (P1 layer) formed on the lower surface of the N1 layer by diffusion. Anode, cathode, and gate electrode films (not shown in FIG. 4) are respectively formed on surfaces of the N1+ and P1 layers, a surface of the N2+ layer, and a surface of the P2 layer, which is exposed from a notched portion 26. The respective electrode films are formed by deposition methods such as evaporation and sputtering.

Figure 5A:
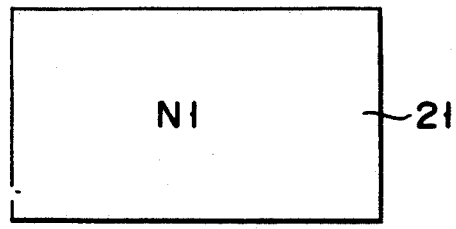
FIGS. 5A to 5E are views showing manufacturing steps for obtaining the arrangement in FIG. 4.
Figure 5B:
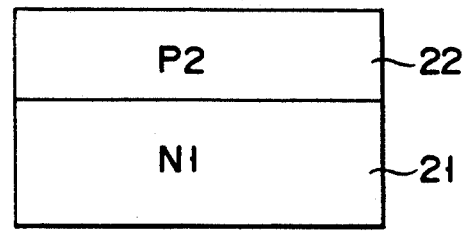
Figure 5C:
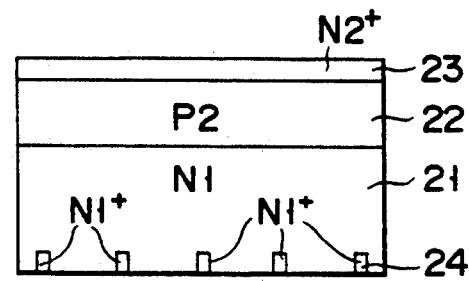
Figure 5D:
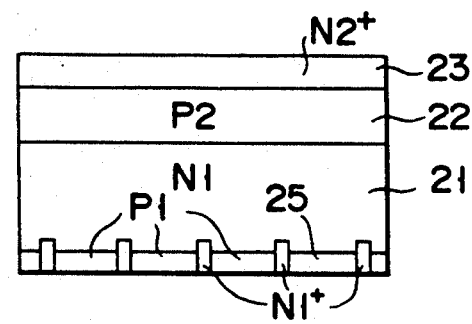
Figure 5E:
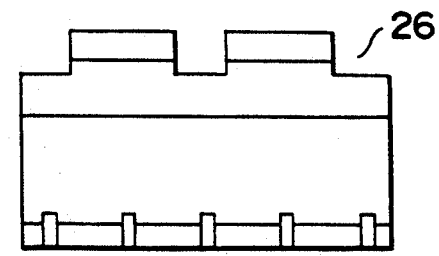
Figure 6A:
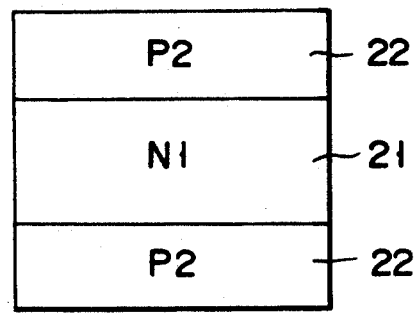
FIGS. 6A to 6B are views showing a modification of the arrangement in FIG. 4.
Figure 6B:
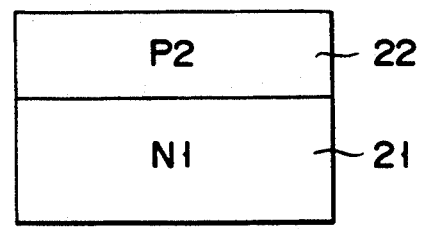
Figure 7A:
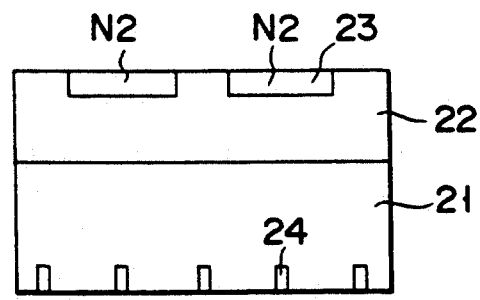
FIGS. 7A and 7B are views each showing still another modification of the arrangement in FIG. 4.
Figure 7B:
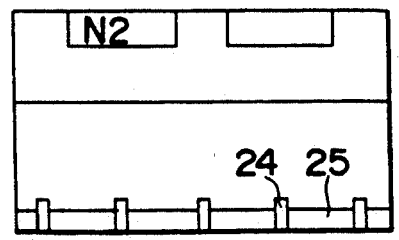

FIGS. 5A to 5E are views showing a method of manufacturing the GTO body in FIG. 4. In the step shown in FIG. 5A, the n-type silicon substrate 21 is prepared. A resistivity $\rho$ and a wafer thickness $W_T$ of the substrate 21 are determined by the specifications of a device. For example, in a 2500-V device, $\rho = 100$ $\Omega$cm and $W_T = 500$ $\mu$m. The P2 layer 22 is formed on a surface of the substrate 21 by diffusion (FIG. 5B). At this time, Ga or B is used as a dopant. The P2 layer 22 has a surface concentration of about $1 \times 10^{18}$ cm$^{-3}$ and a diffusion depth of about 60 $\mu$m. Note that the P2 layers may be formed on the upper and lower surfaces of the substrate as shown in FIG. 6A instead of employing the arrangement in FIG. 5A, and the P2 layer on one surface may then be removed as shown in FIG. 6B. Subsequently, as shown in FIG. 5C, the N1+ layer 24 is selectively formed on the anode side surface, whereas the N2+ layer 23 is formed on the entire cathode side surface by diffusion. The P1 layer 25 is formed on the resultant structure by diffusion so as to have a lower impurity concentration than the N1+ layer and a higher impurity concentration than the substrate 21 (FIG. 5D). With this process, the P1 and N1+ layers are selectively formed on the anode side. As shown in FIG. 5E, surfaces of the N2+ and P2 layers are partially removed, and the surface of the P2 layer is partially exposed. Note that if the N2 layer is selectively formed by diffusion as shown in FIG. 7A, an arrangement shown in FIG. 7B can be obtained without the step of removing the surfaces of the N2 and P2 layers as shown in FIG. 5E.

In this case, the P1 layer preferably has a thickness of 5 to 20 $\mu$m. If the thickness is 5 $\mu$m or less, the current injection efficiency from the P1 layer to the N1 layer is decreased, and a current amplification factor $\alpha_{PNP}$ is decreased, resulting in degradation in ON characteristics. If the thickness is 20 $\mu$m or more, lateral-diffusion occurs, and fine control is difficult to perform, as described above.

Figure 8:
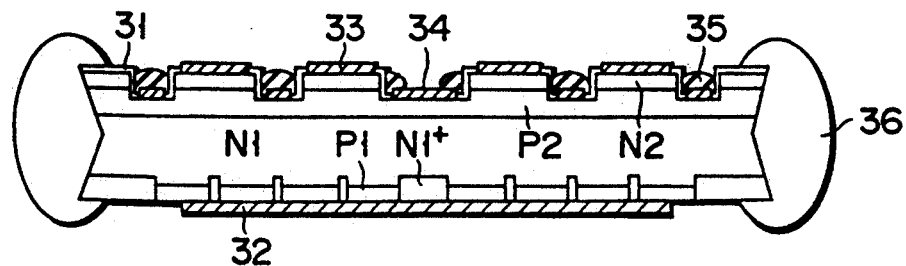
FIG. 8 is a view showing a completed GTO.

After formation of electrodes, a passivation process, and the like, a completed structure similar to a structure used in practice can be obtained, as shown in FIG. 8. More specifically, upon formation of the GTO body shown in FIG. 5E, an SiO$_2$ film 31 is formed across the P2 and N2 layers so as to passivate the P2-N2 junction. Anode, cathode, and gate electrodes 32, 33, and 34 are respectively formed on the P1 and N1+ layers, the N2 layer, and the P2 layer by, e.g., Al evaporation. A polyimide film 35 is then partially coated on the gate electrode 34. A peripheral portion of the resultant structure is beveled, and a silicone resin 36 is coated thereon.

Figure 10:
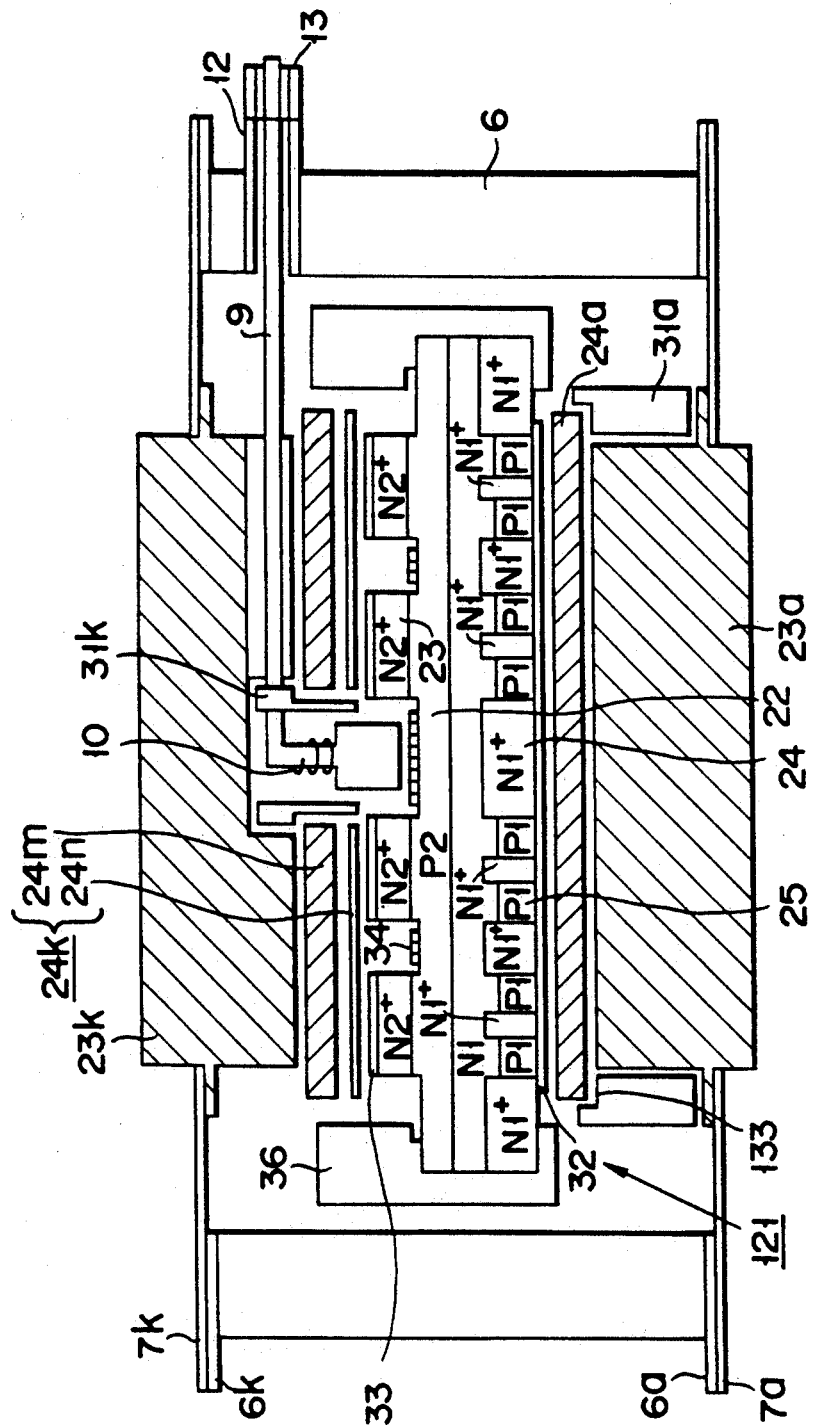
FIG. 10 is a sectional view illustrating the semiconductor device in FIG. 4.

The structure of the GTO will be further described with reference to a sectional view in FIG. 10 illustrating the semiconductor device according to the present invention.

Referring to FIG. 10, a semiconductor pellet 121 has a four-layered structure consisting of a P1 emitter layer 25, an N1+ base layer 24, a P2 base layer 22, and an N2+ emitter layer 23 which are arranged in this order from a second major surface (lower surface in FIG. 10) to a first major surface (upper surface in FIG. 10). The P1 emitter layer 25 is locally formed, and part of the N1+ base layer 24 is exposed from the second major surface (anode side). The emitter layer 23 is divided into a large number of layers. A main electrode (cathode electrode) 33 is formed on the N2+ emitter layer 23 on the first major surface of the semiconductor pellet 121; and a control electrode (gate electrode) 34, on the base layer 22. The main electrode 33 is surrounded by the control electrode 34, i.e., both the electrodes are formed on one major surface in a complex manner. A main electrode (anode electrode) 32 is formed on the other major surface (second major surface) to short-circuit the P1 emitter layer 25 and the partially exposed N1+ base layer 24, thus forming a so-called anode short structure. The cathode electrode 33 on the first major surface of the semiconductor pellet 121 is urged by a cathode electrode post 23k through a cathode side electrode member 24k consisting of an electrode plate 24m and a thin soft metal plate 24n. The anode electrode 32 on the second major surface is urged by an anode electrode post 23a through an anode side electrode member 24a. In order to maintain a predetermined withstand voltage between the anode and the cathode, the side wall of the semiconductor pellet 121 is beveled, and the broken surface is etched and coated with a silicone resin 36 for passivation (protective insulation). A gate lead 9 is arranged in hollow and notched portions of the electrode post 23k and the electrode member 24k through a positioning guide 31k made of an insulating material and an insulating member (not shown). One end of the gate lead 9 is urged against the gate electrode 34 by a gate urge spring 10, and the other end thereof is inserted in a metal sleeve 12 brazed to a side wall of a cylindrical insulating member 6 and extends outside the sleeve 12 to be sealed by a seal portion 13.

Further, the cathode electrode post 23k, anode electrode post 23a, and cylindrical insulating member 6 are silver-brazed and arc-welded to each other through circular metal plates (weld rings) 6k, 6a, 7k, and 7a and therefore constitute an enclosure for airtight sealing the semiconductor pellet 121. The insulating member 6 is made of ceramic material while the metal plates 6k, 6a, 7k, and 7a cobalt.

The anode side electrode member 24a and anode electrode post 23a are positioned by a positioning guide 31a. The positioning guide 31a is an annular cylindrical member made of metal such as aluminum or such insulators as Teflon and epoxy resin and has a stepped portion on the inner circumferential face to prevent the vibrational movement thereof.

As described above, according to the method of manufacturing a semiconductor device of the present invention, since P1 and N1+ layers can be formed shallowly, lateral diffusion is reduced. As a result, the lateral size of the P1 layer can be increased. Therefore, fine control of P1 and N1+ layer patterns can be performed, and variations in characteristics can be eliminated. In addition, an increase in resistance on the N1+ layer can be prevented.

Figure 9:
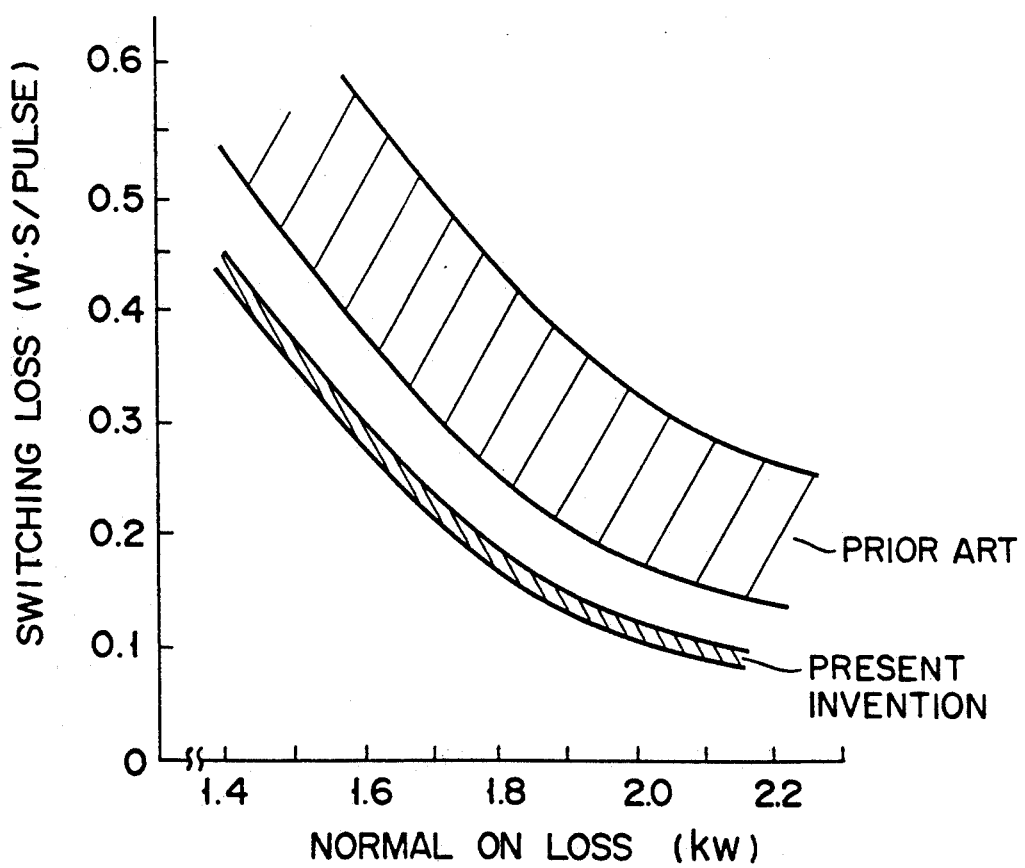
FIG. 9 is a graph showing an effect of reduction in switching loss.

Furthermore, as shown in FIG. 9, according to the semiconductor device of the present invention, the trade-off between a switching loss at the time of ON/OFF operation and a steady ON loss can be increased by about 25% as compared with the conventional arrangement (in this case, a GTO having a gate turn-off current $I_{TGQM} = 700$ A is used). Moreover, the manufacturing method described above is not much different from the conventional method, and allows relatively easy manufacture of the semiconductor device of the present invention at a low cost.

Figure 11A:
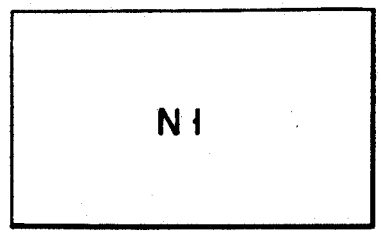
FIGS. 11A to 11E are views showing steps in manufacturing a semiconductor device according to a second embodiment of the present invention.
Figure 11B:
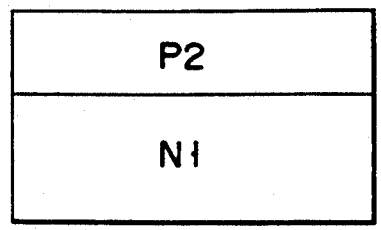
Figure 11C:
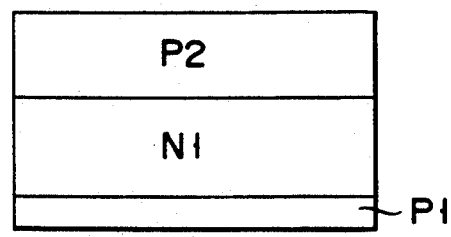
Figure 11D:
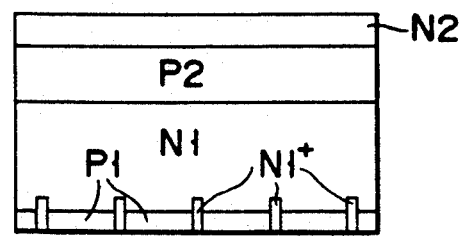
Figure 11E:
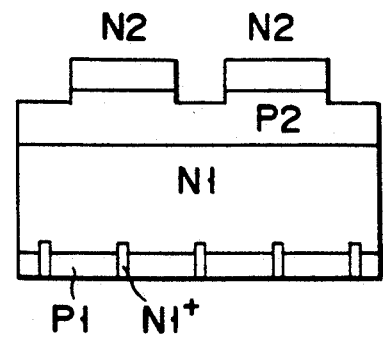

A semiconductor device according to a second embodiment of the present invention will be described below. In this embodiment, as shown in FIG. 11A, a substrate N1 of a first conductivity type which has a relatively high resistivity is prepared. A first layer P2 of a second conductivity type is formed on a surface of the substrate N1 (FIG. 11B). Thereafter, a second layer P1 of the second conductivity type is formed on the lower surface of the substrate N1 so as to be thinner than the first layer P2 (FIG. 11C). As shown in FIG. 11D, a third layer N2 of the first conductivity type is formed on the first layer P2, whereas a fourth layer N1+ of the first conductivity type which has a higher impurity concentration than the second layer P1 is selectively formed thereon. Subsequently, as shown in FIG. 11E, the N2 and P2 layers are partially removed to expose part of the surface of the P2 layer. A gate electrode, a first main electrode, and a second main electrode are respectively formed on the exposed surface of the first layer P2, the surface of the third layer N2, and the second and fourth layers P1 and N1+ by a deposition method.

Figure 12A:
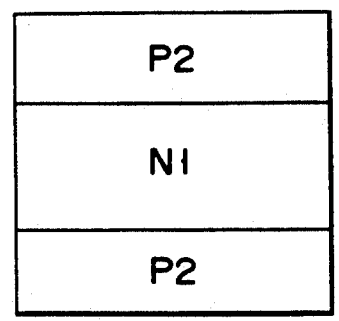
FIGS. 12A and 12B are views showing modifications of the second embodiment.
Figure 12B:
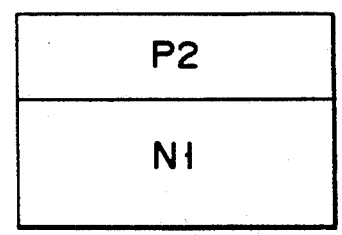
Figure 13:
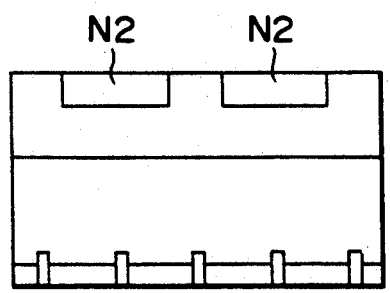
FIG. 13 is a view showing another modification of the second embodiment.

Note that P2 layers may be formed on the upper and lower surfaces of the substrate, as shown in FIG. 12A, instead of employing the arrangement shown in FIG. 11B, and the P2 layer on one surface may be removed, as shown in FIG. 12B. In addition, as shown in FIG. 13, if an N2 layer is selectively formed by diffusion, the step of removing the layers N2 and P2 in FIG. 11E can be omitted.

In addition to the advantages of the first embodiment, the second embodiment has the following advantages. Since the depth of the second layer can be arbitrarily controlled in the second step (FIG. 11C), balanced characteristics can be obtained. In addition, since the fourth layer has a higher impurity concentration and a higher impurity diffusion coefficient than the second layer, the fourth layer can be formed to be deeper than the second layer.

As has been described above, according to the present invention, since fine control of patterning can be performed, a semiconductor device having improved characteristics and a method of manufacturing the same can be provided.

What is claimed is:

1. A method of manufacturing a semiconductor device from a substrate of a first conductivity type having first and second surfaces, comprising the steps of:
    forming a first layer of a second conductivity type on the first surface of said substrate, the first layer having a first thickness;
    forming a second layer of the first conductivity type on said first layer;
    selectively forming a third layer of the first conductivity type on the second surface of said substrate, the third layer having a second thickness; and
    forming a fourth layer of the second conductivity type, on the second surface of said substrate, to have a thickness within the range of 5 to 20 $\mu$m and smaller than the first thickness and then the second thickness and to have an impurity concentration higher than an impurity concentration of said substrate and lower than an impurity concentration of said third layer.

2. A method of manufacturing a semiconductor device from a substrate of a first conductivity type having first and second surfaces, comprising the steps of:
    forming a first layer of a second conductivity type on the first surface of said substrate, the first layer having a first thickness;
    forming a second layer of the first conductivity type on said first layer;
    selectivity forming a third layer of the first conductivity type on the second surface of said substrate, the third layer having a second thickness;
    forming a fourth layer of the second conductivity type, on the second surface of said substrate, to have a thickness within the range of 5 to 20 $\mu$m and smaller than the first thickness and than the second thickness and to have an impurity concentration higher than an impurity concentration of said substrate and lower than an impurity concentration of said third layer;
    forming a gate electrode on a selected surface portion of of said first layer;
    forming a first main electrode on one surface of said second layer; and
    forming a second main electrode on said third and fourth layers.

3. A method according to claim 2, further comprising the step of removing part of said second layer by a post-treatment and partially exposing said first layer.

4. A method according to claim 2, further comprising the step of, upon formation of said first layer, forming layers of the second conductivity type on one and the other surfaces of said substrate, and removing said layer of the second conductivity type formed on the other surface.

5. A method according to claim 2, wherein said second layer is selectively formed on one surface of said first layer by diffusion.

6. A method according to claim 2, wherein said gate electrode and said first and second main electrodes are formed by a deposition method.

7. A method of manufacturing a semiconductor device from a substrate of a first conductivity type having first and second surfaces, comprising the steps of:
    forming a first layer of a second conductivity type on the first surface of said substrate, the first layer having a first thickness;
    forming a second layer of the second conductivity type, on the second surface of said substrate, to have a thickness smaller than the first thickness;
    forming a third layer of the first conductivity type on said first layer; and
    selectively forming a fourth layer of the first conductivity type, on said second layer, to have a thickness within the range of 5 to 20 $\mu$m, and to have an impurity concentration higher than an impurity concentration of said second layer.

8. A method of manufacturing a semiconductor device from a substrate of a first conductivity type having first and second surfaces, comprising the steps of:

forming a first layer of a second conductivity type on the first surface of said substrate, the first layer having a first thickness;

forming a second layer of the second conductivity type, on the second surface of said substrate, to have a thickness smaller than the first thickness;

forming a third layer of the first conductivity type on said first layer;

selectively forming a fourth layer of the first conductivity type, on said second layer, to have a thickness within the range of 5 to 20 $\mu$m, and to have an impurity concentration higher than an impurity concentration of said second layer;

forming a gate electrode on part of said first layer;

forming a first main electrode on said third layer; and forming a second main electrode on said second and fourth layers.

* * * * *